US010978367B2

(12) United States Patent
Kudou et al.

(10) Patent No.: US 10,978,367 B2
(45) Date of Patent: Apr. 13, 2021

(54) SEMICONDUCTOR DEVICE AND METHOD FOR MANUFACTURING THE SAME

(71) Applicant: Panasonic Intellectual Property Management Co., Ltd., Osaka (JP)

(72) Inventors: Chiaki Kudou, Toyama (JP); Takashi Hasegawa, Toyama (JP); Kouichi Saitou, Toyama (JP)

(73) Assignee: PANASONIC INTELLECTUAL PROPRETY MANAGEMENT CO., LTD., Osaka (JP)

( * ) Notice: Subject to any disclaimer, the term of this patent is extended or adjusted under 35 U.S.C. 154(b) by 34 days.

(21) Appl. No.: 16/112,116

(22) Filed: Aug. 24, 2018

(65) Prior Publication Data

US 2019/0080976 A1     Mar. 14, 2019

(30) Foreign Application Priority Data

Sep. 12, 2017   (JP) .............................. JP2017-174480

(51) Int. Cl.
*H01L 23/00*     (2006.01)
*H01L 23/31*     (2006.01)
(Continued)

(52) U.S. Cl.
CPC ........ *H01L 23/3192* (2013.01); *H01L 21/022* (2013.01); *H01L 21/0217* (2013.01); *H01L 21/02118* (2013.01); *H01L 21/02164* (2013.01); *H01L 21/31116* (2013.01); *H01L 23/291* (2013.01); *H01L 23/293* (2013.01); *H01L 23/562* (2013.01); *H01L 29/0619* (2013.01);
(Continued)

(58) Field of Classification Search
CPC ........... H01L 23/3192; H01L 21/02118; H01L 21/02164
See application file for complete search history.

(56) References Cited

U.S. PATENT DOCUMENTS

2013/0306982 A1* 11/2013 Kudou ................ H01L 29/4236
257/76
2014/0197476 A1   7/2014 Shimatou
2017/0110545 A1   4/2017 Nagao et al.

FOREIGN PATENT DOCUMENTS

JP      2014-138090     7/2014
JP      2015-220334     12/2015

* cited by examiner

*Primary Examiner* — Mounir S Amer
*Assistant Examiner* — Alexander Belousov
(74) *Attorney, Agent, or Firm* — McDermott Will & Emery LLP

(57) ABSTRACT

A semiconductor device according to an exemplary embodiment includes a semiconductor substrate, an interlayer insulating layer, at least one electrode, an inorganic protective layer, and an organic protective layer. The interlayer insulating layer is formed on the semiconductor substrate and has at least one opening. The at least one electrode has part formed on an edge of the at least one opening, and has other part electrically connected, in the at least one opening, to the semiconductor substrate. The inorganic protective layer includes an inner edge portion and an outer edge portion. The inner edge portion covers an edge of the at least one electrode. The inorganic protective layer, except for the inner edge portion, is formed on the interlayer insulating layer. The organic protective layer covers the inorganic protective layer. One of the inner edge portion and the outer edge portion of the inorganic protective layer has an undercut.

9 Claims, 8 Drawing Sheets

(51) Int. Cl.
*H01L 23/29* (2006.01)
*H01L 29/16* (2006.01)
*H01L 21/311* (2006.01)
*H01L 29/872* (2006.01)
*H01L 21/02* (2006.01)
*H01L 29/78* (2006.01)
*H01L 29/06* (2006.01)

(52) U.S. Cl.
CPC ...... *H01L 29/0638* (2013.01); *H01L 29/1608* (2013.01); *H01L 29/7802* (2013.01); *H01L 29/7811* (2013.01); *H01L 29/872* (2013.01)

SEMICONDUCTOR DEVICE AND METHOD FOR MANUFACTURING THE SAME

BACKGROUND

1. Technical Field

The present disclosure relates to a semiconductor device and a method for manufacturing the semiconductor device.

2. Description of the Related Art

A power semiconductor device is a semiconductor element used to cause a high current to flow with a high breakdown voltage, and is required to have a low loss. Conventionally, power semiconductor devices using a silicon (Si) substrate have been dominant. In recent years, however, power semiconductor devices using a silicon carbide (SiC) substrate have received attention and have been developed.

Silicon carbide (SiC) has a dielectric breakdown voltage one digit higher than a dielectric breakdown voltage of silicon (Si), and thus has a feature of being capable of maintaining a breakdown voltage even with a thin depletion layer at a pn junction or a Schottky contact. Such a feature allows a device using silicon carbide to have a reduced thickness and a high doping concentration. Accordingly, silicon carbide is expected to be used as a material for forming a power semiconductor device having a low on resistance, a high breakdown voltage, and a low loss.

Vehicles having a motor as a drive source, such as hybrid vehicles, electric vehicles, and fuel cell vehicles, have been recently developed. The aforementioned feature is advantageous to a switching element in an inverter circuit for driving the motor of these vehicles. In view of this, on board silicon carbide power semiconductor devices have been developed.

Considering that vehicles may be used under various outdoor environments, on board electronic components are required to have greater durability against severe environmental conditions than other consumer electronic components. For example, the durability of electronic components is evaluated by a temperature humidity bias test. PTL 1 and PTL 2 disclose semiconductor devices having reliability for high-temperature high-humidity bias environments.

CITATION LIST

Patent Literature

PTL 1: Unexamined Japanese Patent Publication No. 2015-220334

PTL 2: Unexamined Japanese Patent Publication No. 2014-138090

SUMMARY

The present disclosure provides a new technique to improve reliability of a semiconductor device, such as a power semiconductor device. A power semiconductor device will hereinafter be referred to simply as a "semiconductor device".

A semiconductor device according to an aspect of the present disclosure includes a semiconductor substrate, an interlayer insulating layer, at least one electrode, an inorganic protective layer, and an organic protective layer. The interlayer insulating layer is formed on the semiconductor substrate and has at least one opening. The at least one electrode has part formed on an edge of the at least one opening, and has other part electrically connected, in the at least one opening, to the semiconductor substrate. The inorganic protective layer includes an inner edge portion and an outer edge portion. The inner edge portion covers an edge of the at least one electrode. The inorganic protective layer, except for the inner edge portion, is thrilled on the interlayer insulating layer. The organic protective layer covers the inorganic protective layer. At least one of the inner edge portion and the outer edge portion of the inorganic protective layer has an undercut. The undercut is in contact with the organic protective layer.

A method for manufacturing a semiconductor device according to another aspect of the present disclosure includes a first step, a second step, a third step, a fourth step, and a fifth step. The first step is a step of preparing a semiconductor substrate. The second step is a step of forming, on the semiconductor substrate, an interlayer insulating layer having at least one opening. The third step is a step of forming part of at least one electrode on an edge of the at least one opening, and electrically connecting; other part of the at least one, electrode to the semiconductor substrate in the at least one opening. The fourth step is a step of covering an edge of the at least one electrode with an inner edge portion of an inorganic protective layer including the inner edge portion and an outer edge portion, and forming the inorganic protective layer, except for the inner edge portion, on the interlayer insulating layer. The fifth step is a step of covering the inorganic protective layer with an organic protective layer.

The technique according to the present disclosure improves reliability of a semiconductor device.

DETAILED DESCRIPTION

Figure 1:
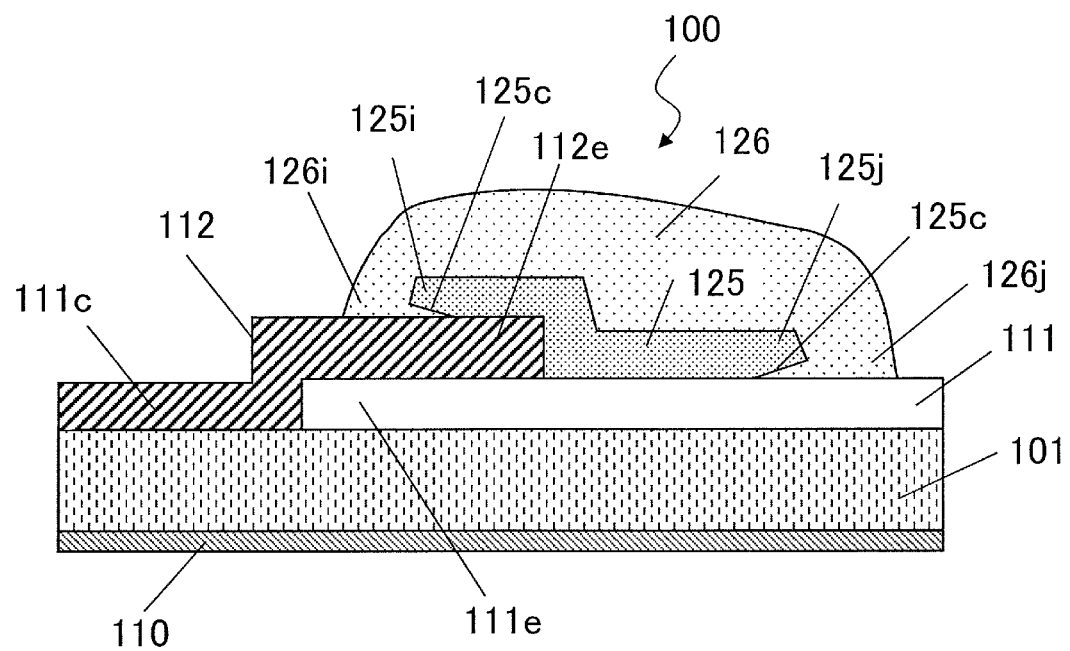
FIG. 1 is a schematic cross-sectional view of an example configuration of semiconductor device 100 according to an exemplary embodiment.

In view of reliability, a semiconductor device may include, as surface protective layers, an inorganic protective layer and an organic protective layer formed on the inorganic protective layer. Functions of the inorganic protective film and the organic protective film will be described later.

The organic protective layer has an expansion coefficient higher than an expansion coefficient, of the inorganic protective layer. Studies conducted by the inventors of the present disclosure show that changes in temperature during usage cause the organic protective layer to shrink significantly and thus peel or loosen, resulting in lower reliability of the semiconductor device.

In accordance with the above studies, the inventors of the present disclosure have arrived at a semiconductor device and a method for manufacturing the semiconductor device described in Items below.

[Item 1]
A semiconductor device includes a semiconductor substrate, an interlayer insulating layer, at least one electrode, an inorganic protective layer, and an organic protective layer. The interlayer insulating layer is formed on the semiconductor substrate and has at least one opening. The at least one electrode has part, formed on an edge of the at least one opening, and has other pan electrically connected, in the at least one opening, to the semiconductor substrate. The inorganic protective layer includes an inner edge portion and an outer edge portion. The inner edge portion covers an edge of the at least one electrode. The inorganic protective layer, except for the inner edge portion, is formed on the interlayer insulating layer. The organic protective layer covers the inorganic protective layer. At least one of the inner edge portion and the outer edge portion of the inorganic protective layer has an undercut. The undercut is in contact with the organic protective layer.

[Item 2]
In the semiconductor device according to Item 1, the inner edge portion and the outer edge portion of the inorganic protective layer each have the undercut.

[Item 3]
In the semiconductor device according to Item 1 or 2, the interlayer insulating layer is non-doped silica glass.

[Item 4]
In the semiconductor device according to any one of Items 1 to 3, the at least one electrode is aluminum.

[Item 5]
In the semiconductor device according to any one of Items 1 to 4, the inorganic protective layer is silicon nitride or silicon oxide.

[Item 6]
In the semiconductor device according to any one of Items 1 to 5, the organic protective layer is polyimide or polybenzoxazole.

[Item 7]
In the semiconductor device according to any one of Items 1 to 6, the undercut has a depth ranging from 0.45 μm to 1 μm inclusive in a direction parallel to the principal surface of the semiconductor substrate.

[Item 8]
In the semiconductor device according to any one of Items 1 to 7, the undercut of the inner edge portion of the inorganic protective layer is greater in depth than the undercut of the outer edge portion of the inorganic protective layer in a direction parallel to the principal surface of the semiconductor substrate.

[Item 9]
In the semiconductor device according to any one of Items 1 to 8, the organic protective layer has a thickness ranging from 3 μm to 10 μm inclusive.

[Item 10]
In the semiconductor device according to any one of Items 1 to 9, the semiconductor device is a metal oxide semiconductor field effect transistor and includes three electrodes. The three electrodes are two source electrodes anti one gate electrode.

[Item 11]
In the semiconductor device according to any one of Items 1 to 9, the semiconductor device is a Schottky barrier diode, and includes one electrode.

[Item 12]
A method for manufacturing a semiconductor device includes a first step, a second step, a third step, a fourth step, and a fifth step. The first step is a step of preparing a semiconductor substrate. The second step is a step of forming, on the semiconductor substrate, an interlayer insulating layer having at least one opening. The third step is a step of forming part of at least one electrode on an edge of the at least one opening, and electrically connecting other part of the at least one electrode to the semiconductor substrate in the at least one opening. The fourth step is a step of covering an edge of the at least one electrode with an inner edge portion of an inorganic protective layer including the inner edge portion and an outer edge portion, and forming the inorganic protective layer, except for the inner edge portion, on the interlayer insulating layer. The fifth step is a step of covering the inorganic protective layer with an organic protective layer.

[Item 13]
In the method according to Item 12, the undercut is formed by performing isotropic etching after anisotropic etching.

[Item 14]
In the method according to Item 12, the undercut is formed by performing isotropic etching.

[Item 15]
In the method according to Item 13 or 14, the isotropic etching is performed using a gas mixture of carbon fluoride gas and oxygen gas.

Accordingly, peeling of the organic protective layer is suppressed, thereby improving reliability of the semiconductor device.

Specific exemplary embodiments of the present disclosure will be described below. However, unnecessarily detailed descriptions may be omitted. For example, a detailed description of well-known matters, and a duplicate description of substantially identical configurations may not be provided. This is to avoid unnecessary redundancy in the following description and to facilitate understanding of those skilled in the art. Here, the inventors provide the accompanying drawings and the following description such that those skilled in the art can sufficiently understand the present disclosure, and the subject matters of claims are not intended to be limited by the accompanying drawings and the following description. In the following description, components having the same or similar functions are denoted by the same reference numerals.

First Exemplary Embodiment

A general description of the present disclosure will be given below with reference to schematic diagrams. The present disclosure is applicable to surface protective layers of semiconductor devices. Examples of the semiconductor devices include metal oxide semiconductor field effect transistors (MOSFETs) and Schottky barrier diodes. Also, semiconductor materials other than silicon carbide may be used in the semiconductor devices.

FIG. 1 is a schematic cross-sectional view of an example configuration of semiconductor device 100 according to an exemplary embodiment.

Semiconductor device 100 according to the exemplary embodiment includes semiconductor substrate 101 interlayer insulating layer 111, at least one electrode 112, inorganic protective layer 125, and organic protective layer 126.

Interlayer insulating layer 111 is formed on semiconductor substrate 101 and has at least one opening 111c. Interlayer insulating layer 111 is non-doped silica glass (NSG), for example.

Part of electrode 112 is formed on edge 111e of opening 111c, and the other part is electrically connected to semiconductor substrate 101 in opening 111c. Electrode 112 is aluminum (Al), for example.

Semiconductor substrate 101, which has interlayer insulating layer 111 and electrode 112 formed on one side, may have another electrode 110 formed on the other side.

Inorganic protective layer 125 has inner edge portion 125i and outer edge portion 125j. Inner edge portion 125i covers edge 112e of electrode 112. Except for inner edge portion 125i, inorganic protective layer 125 is formed oil interlayer insulating layer 111. When included of dense inorganic material, inorganic protective layer 125 has excellent moisture barrier properties. Inorganic protective layer 125 is made of silicon nitride or silicon oxide, for example.

Organic protective layer 126 covers inorganic protective layer 125. Organic protective layer 126 is made of organic material, and thus has poorer moisture-barrier properties than inorganic protective layer 125. The organic material, however, is lower in hardness than inorganic protective layer 125. Hence, external stress applied on organic protective layer 126 is unlikely to cause organic protective layer 126 to break or crack. Accordingly, when semiconductor device 100 is packaged, organic protective layer 126 functions as a buffer material against stress generated as a result of hardening of mold resin formed on organic protective layer 126 and against contact with a filler within the mold resin, thereby suppressing breakage and cracks of inorganic protective layer 125. Organic protective layer 126 is made of polyimide or polybenzoxazole (PBO), for example.

At least one of inner edge portion 125i and outer edge portion 125j of inorganic protective layer 125 has undercut 125c. Undercut 125c is in contact with organic protective layer 126.

In this specification, the term "undercut" means a shape obtained by cutting away a lower part of at least one of inner edge portion 125i and outer edge portion 125j of inorganic protective layer 125.

In FIG. 1, inner edge portion 125i and outer edge portion 125j of inorganic protective layer 125 each have undercut 125c. That is, a space exists between undercut 125c of inner edge portion 125i of inorganic protective layer 125 and electrode 112. Likewise, a space exists between undercut 125c of outer edge portion 125j of inorganic protective layer 125 and interlayer insulating layer 111. Filling the spaces with organic protective layer 126 brings undercuts 125c into contact with organic protective layer 126. The parts of organic protective layer 126 filling the spaces function as wedges. Accordingly, even if an end of inner edge portion 126i of organic protective layer 126 loosens, undercut 125c of inner edge portion 125i of inorganic protective layer 125 suppresses peeling of organic protective layer 126 occurring on the inner side. Similarly, even if an end of outer edge portion 126j of organic protective layer 126 loosens, undercut 125c of outer edge portion 125j of inorganic protective layer 125 suppresses peeling of organic protective layer 126 occurring on the outer side.

In semiconductor device 100 according to the present exemplary embodiment, peeling of organic protective layer 126 is suppressed even in a high-temperature environment. Thus, even when an external force is exerted in a high-temperature environment, organic protective layer 126 serves as a buffer material to protect inorganic protective layer 125. In addition, inorganic protective layer 125 prevents moisture from entering semiconductor device 100 even in a high humidity environment. As a result, semiconductor device 100 according to the present exemplary embodiment has high reliability even in a high temperature high humidity environment.

Undercut 125c provides higher reliability as compared to conventional semiconductor devices even when undercut 125c is formed in one, instead of both, of inner edge portion 125i and outer edge portion 125j of inorganic protective layer 125.

Also, inner edge portion 125i of inorganic protective layer 125 may be located inwardly of edge 112e of electrode 112, that is, above electrode 112.

Figure 2:
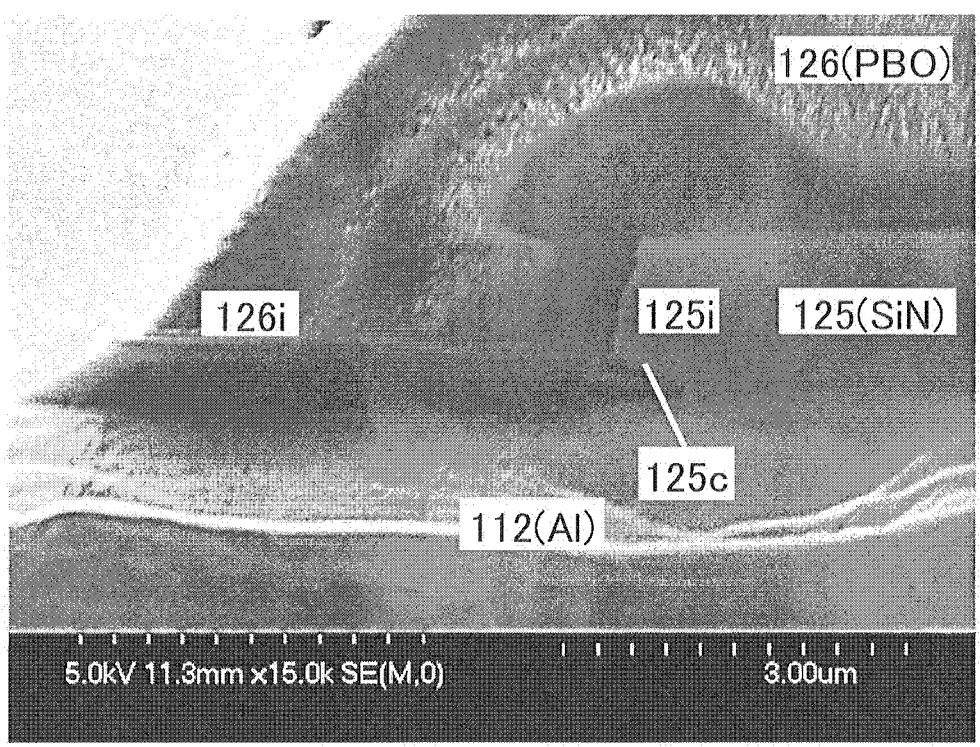
FIG. 2 is an example of a scanning electron microscope photograph of undercut 125c of inner edge portion 125i of inorganic protective layer (SiN) 125 of FIG. 1.

FIG. 2 is an example of a scanning electron microscope photograph of undercut 125c of inner edge portion 125i of inorganic protective layer (SiN) 125 of FIG. 1. It can be seen from FIG. 2 that inner edge portion 125i of inorganic protective layer (SiN) 125 has undercut 125c, and that the space between undercut. 125c and electrode (A) 112 is filled with organic protective layer (PBO) 126.

The following describes an example of a method for manufacturing semiconductor device 100 according to the present exemplary embodiment.

The method for manufacturing semiconductor device 100 according to the present exemplary embodiment includes first to fifth steps described below.

In the first step, semiconductor substrate 101 is prepared.

In the second step, interlayer insulating layer 111 having at least one opening 111c is formed on semiconductor substrate 101.

In the third step, part of at least one electrode 112 is formed on edge 111e of at least one opening 111c, and the other part is electrically connected to semiconductor substrate 101 in opening 111c.

In the fourth step, edge 112e of at least one electrode 112 is covered with inner edge portion 125i of inorganic protective layer 125, and inorganic protective layer 125, except for inner edge portion 125i, is formed on interlayer insulating layer 111.

In the fifth step, inorganic protective layer 125 is covered with organic protective layer 120. Specifically, polyimide or polybenzoxazole is applied onto inorganic protective layer 125 by spin coating, for example. In the spin coating, the space between undercut 125c of inner edge portion 125i and electrode 112 and the space between undercut 125c of outer edge portion 125j and interlayer insulating layer 111 are filled with polyimide or polybenzoxazole without generation of voids. Exposure, development, and bake processes are then performed to form organic protective layer 126. Organic protective layer 126 has a thickness ranging from 3 μm to 10 μm (inclusive) in a direction perpendicular to semiconductor substrate 101.

The following describes the aforementioned fourth step in detail.

FIGS. 3A to 3E are schematic views of examples of the fourth step.

Figure 3A:
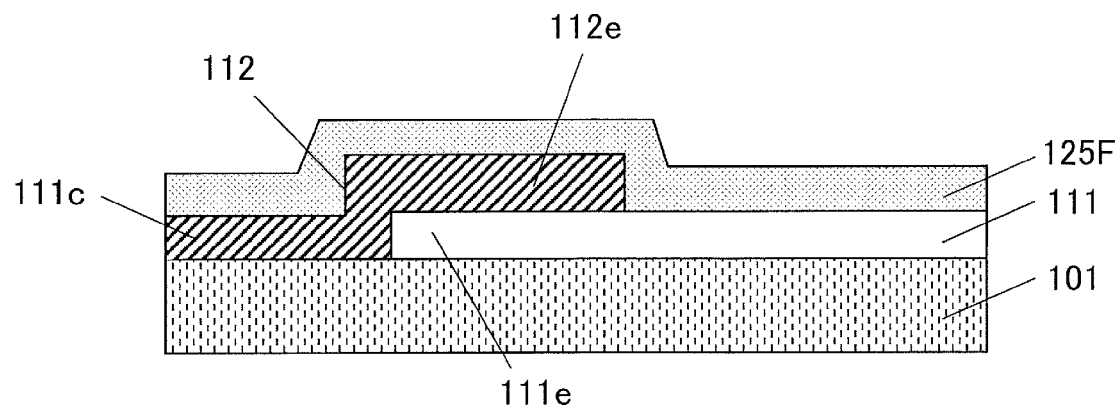
FIG. 3A is a schematic view of an example of a fourth step.

As shown in FIG. 3A, inorganic protective film 125F is formed on electrode 112 and interlayer insulating layer 111. For example, silicon nitride is deposited as inorganic protective film 125F by a plasma chemical vapor deposition (CVD) process. Inorganic protective film 125F has a thickness ranging from 0.2 μm to 2 μm (inclusive) in the direction perpendicular to semiconductor substrate 101.

Figure 3B:
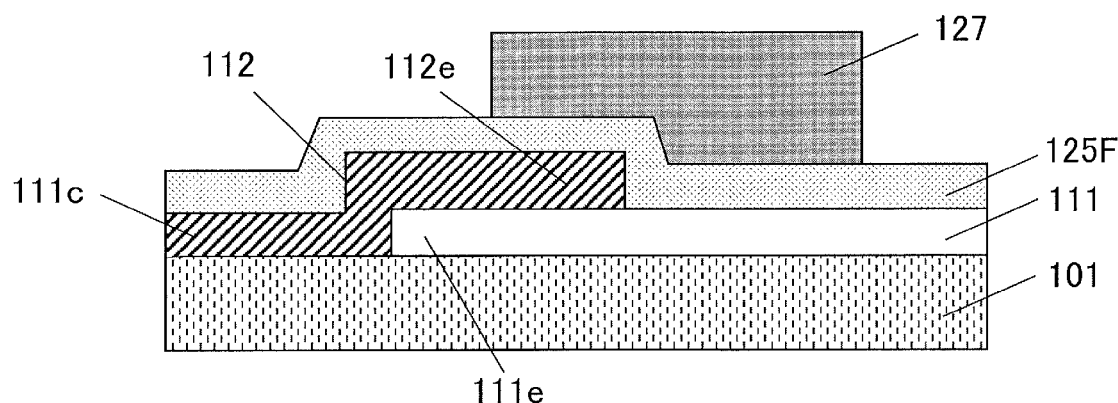
FIG. 3B is a schematic view of an example of the fourth step.

As shown in FIG. 3B, resist layer 127 is formed on inorganic protective film 125F.

Figure 3C:
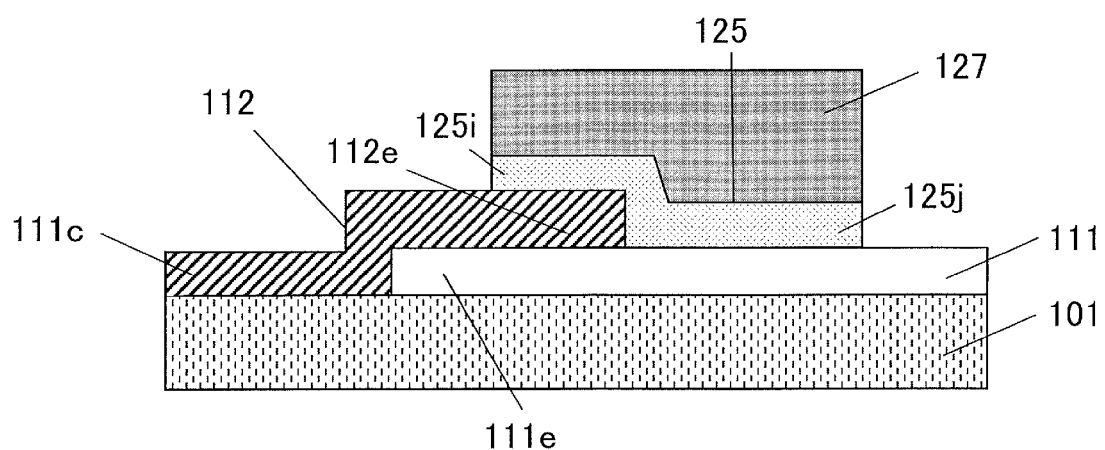
FIG. 3C is a schematic view of an example of the fourth step.

As shown in FIG. 3C, anisotropic etching is performed to remove unnecessary part of inorganic protective film 125F. In the anisotropic etching, reaction proceeds mainly in the direction perpendicular to semiconductor substrate 101.

Figure 3D:
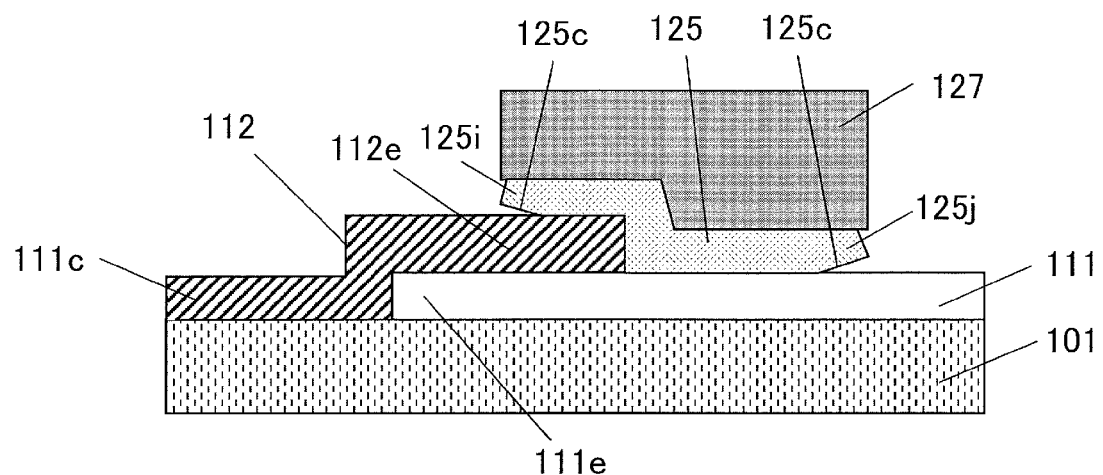
FIG. 3D is a schematic view of an example of the fourth step.

As shown in FIG. 3D, when inorganic protective layer 125 is formed, isotropic etching is performed as overetching to form undercut 125c at least in one of inner edge portion 125i and outer edge portion 125j of inorganic protective layer 125. The isotropic etching is performed using a gas mixture of carbon fluoride ($CF_4$) gas and oxygen ($O_2$) gas. In isotropic etching, unlike anisotropic etching, reaction equally proceeds mainly in directions parallel and perpendicular to semiconductor substrate 101. In the isotropic etching performed as overetching, reaction proceeds mainly in the parallel direction due to the lack of material to be etched in the perpendicular direction. At this time, an upper part of at least one of inner edge portion 125i and outer edge portion 125j of inorganic protective layer 125 is also removed.

Figure 3E:
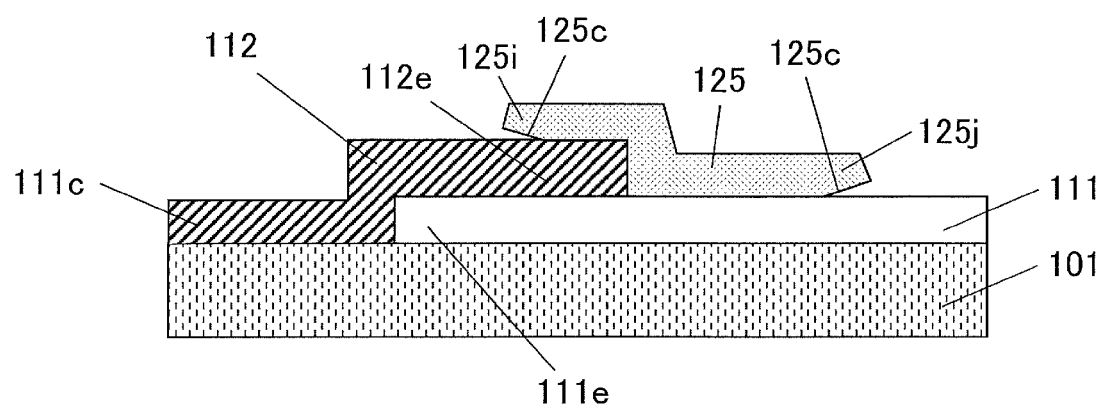
FIG. 3E is a schematic view of an example of the fourth step.

As shown in FIG. 3E, resist layer 127 is removed.

As shown in FIGS. 3C and 3D, undercuts 125c are formed by performing the isotropic etching after the anisotropic etching. Conventionally, the presence of undercut 125c has been undesirable. Thus, only anisotropic etching has been performed without performing isotropic etching.

Note that when the anisotropic etching of FIG. 3C is performed under the conditions for the isotropic etching shown in FIG. 3D, similar effects are also achievable.

A depth of undercuts 125c in the direction parallel to semiconductor substrate 101 depends on the base underlying inorganic protective layer 125.

Figure 4A:
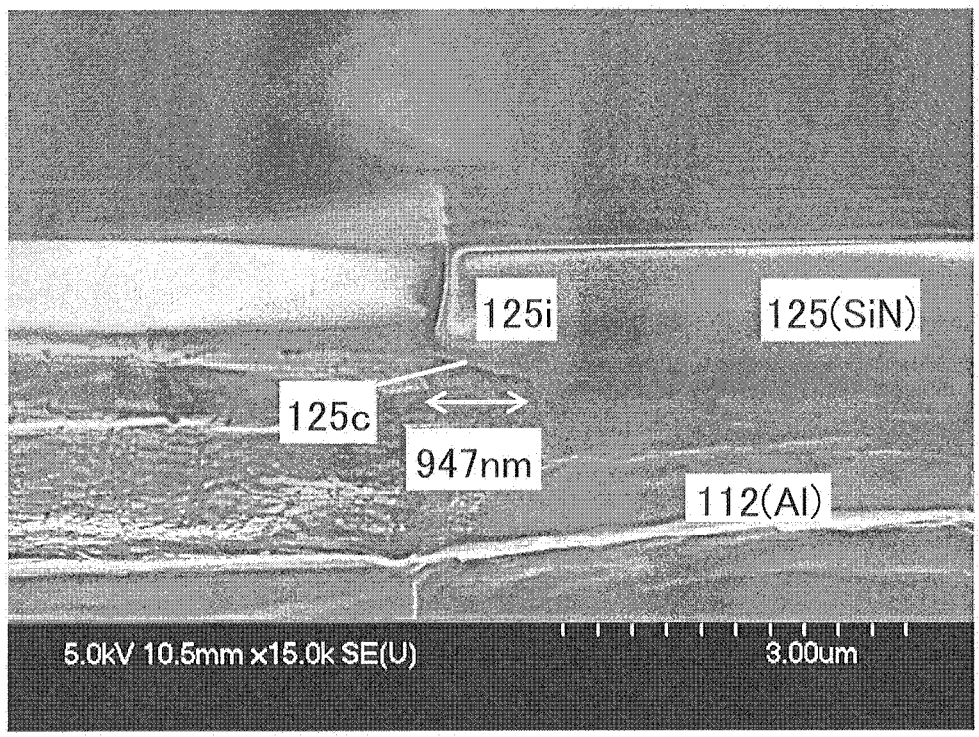
FIG. 4A is an example of a scanning electron microscope photograph of undercut 125c of inner edge portion 125i of inorganic protective layer (SiN) 125 of FIG. 3E.
Figure 4B:
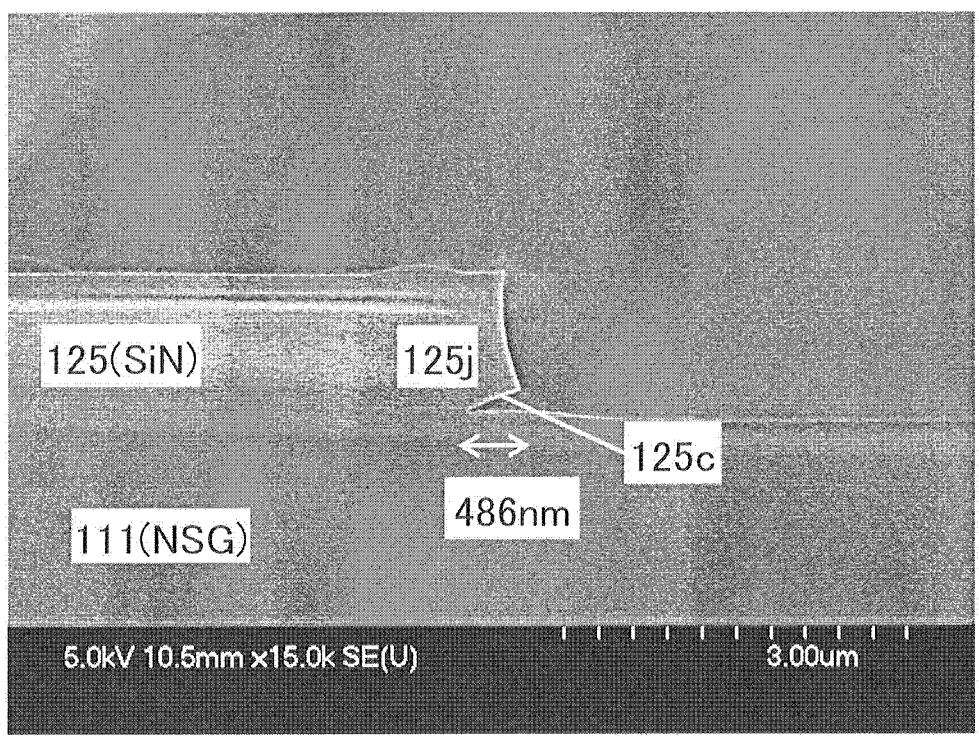
FIG. 4B is an example of a scanning electron microscope photograph of undercut 125c of outer edge portion 125j of inorganic protective layer (SiN) 125 of FIG. 3E.

FIG. 4A is an example of a scanning electron microscope photograph of undercut 125c of inner edge portion 125i of inorganic protective layer (SiN) 125 of FIG. 3E. FIG. 4B is an example of a scanning electron microscope photograph of undercut 125c of outer edge portion 125j of inorganic protective layer (SiN) 125 of FIG. 3E. The base underlying inner edge portion 125i is electrode (Al) 112, and the base underlying outer edge portion 125j is interlayer insulating layer (NSG) 111.

When isotropic etching is performed for a period of time corresponding to 30% of the thickness of inorganic protective layer (SiN) 125, undercut 125c of inner edge portion 125i has a depth of 947 nm, and undercut 125c of outer edge portion 125j has a depth of 486 nm in the direction parallel to semiconductor substrate 101. The ratio between undercut 125c of inner edge portion 125i and undercut 125c of outer edge portion 125j is approximately 2-1.

From the above, it can be seen that undercuts 125c have a depth ranging from 0.45 μm to 1 μm (inclusive) in the direction parallel to semiconductor substrate 101, and that undercut 125c of inner edge portion 125i of inorganic protective layer (SiN) 125 is greater in depth than undercut 125c of outer edge portion 125j of inorganic protective layer (SiN) 125 in the direction parallel to semiconductor substrate 101.

Adhesion between organic protective layer (PBO) 126 and interlayer insulating layer (NSG) 111 is relatively good, and outer edge portion 126j of organic protective layer (PBO) 126 is less likely to loosen. Hence, the small depth of undercut 125c of outer edge portion 125j of inorganic protective layer (SiN) 125 in the direction parallel to semiconductor substrate 101 does not create a problem.

On the other hand, adhesion between organic protective layer (PBO) 126 and electrode (Al) 112 is relatively poor, and inner edge portion 126i of organic protective layer (PBO) 126 is likely to loosen. Therefore, when undercut 125c of inner edge portion 125i of inorganic protective layer (SiN) 125 has the great depth in the direction parallel to semiconductor substrate 101, peeling of organic protective layer (PBO) 126 is effectively suppressed on the inner side.

Second Exemplary Embodiment

The following describes an example in which the arrangement of inorganic protective layer 125 and organic protective layer 126 according to the first exemplary embodiment is applied to a MOSFET. The MOSFET will hereinafter be referred to simply as the "semiconductor device".

Figure 5A:
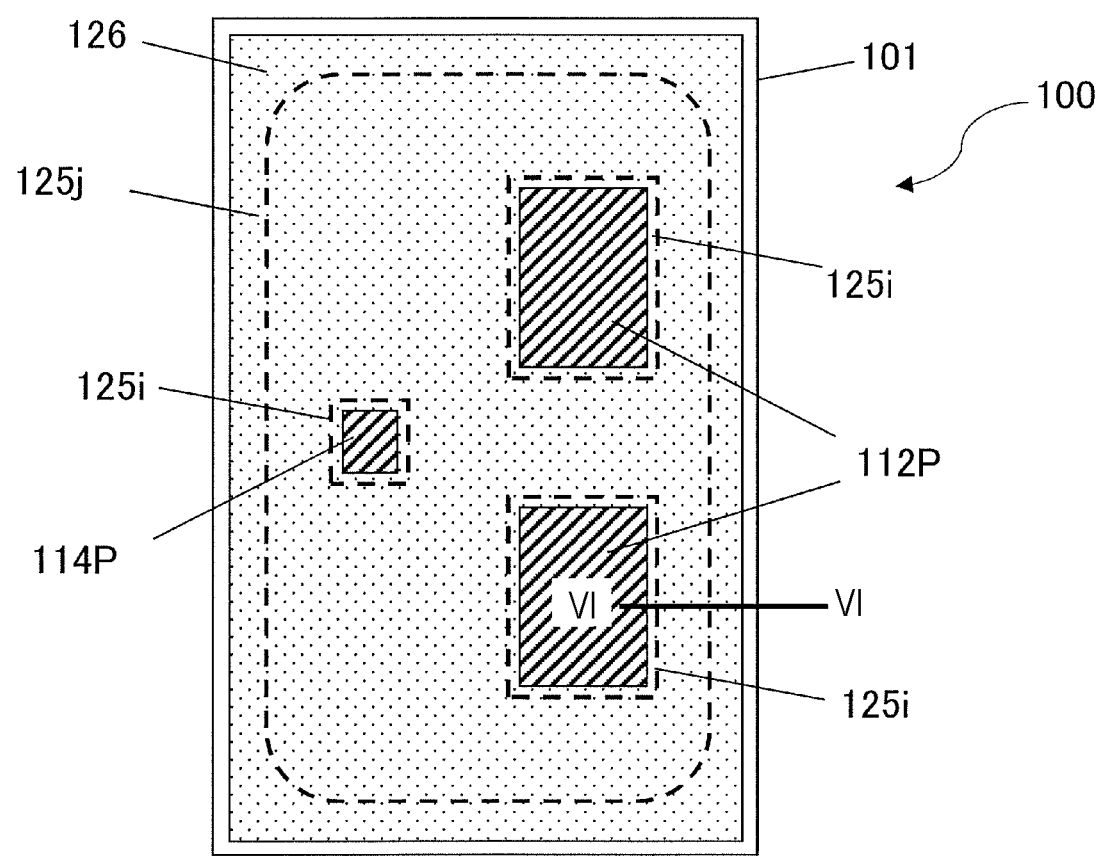
FIG. 5A is a schematic plan view of an example configuration of semiconductor device 100 according to the exemplary embodiment.

FIG. 5A is a schematic plan view of an example configuration of semiconductor device 100 according to the present exemplary embodiment. Source pad regions 112P and gate pad region 114P are exposed at organic protective layer 126. The pad regions are regions where wires or ribbons, for example, are connected to establish connection with package terminals. Inorganic protective layer 125 is positioned under organic protective layer 126. Closed broken lines indicate end faces of three inner edge portions 125i and an end face of one outer edge portion 125j of inorganic protective layer 125. Three inner edge portions 125i and one outer edge portion 125j each have undercut 125c. This configuration suppresses peeling of organic protective layer 126 in any direction.

Figure 5B:
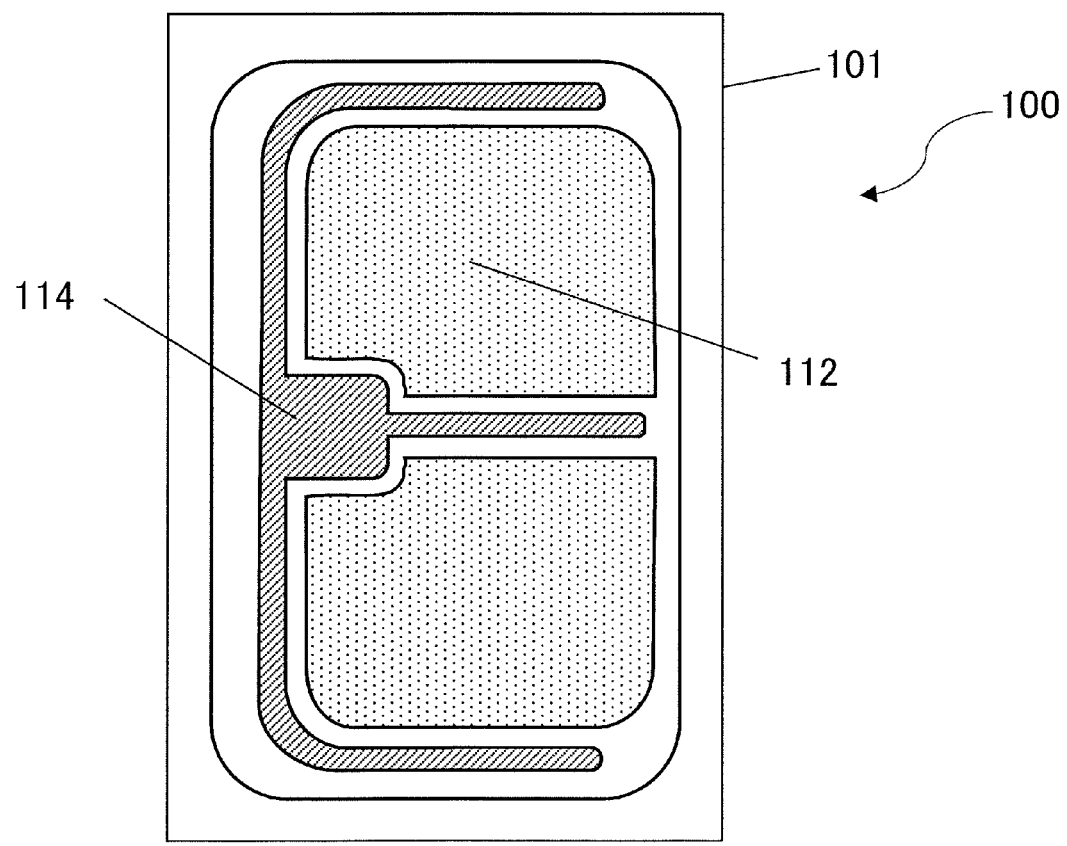
FIG. 5B is a schematic plan view of an example configuration of electrodes under inorganic protective layer 125 and organic protective layer 126.

FIG. 5B is a schematic plan view of an example configuration of electrodes under inorganic protective layer 125 and organic protective layer 126. In this example configuration, semiconductor device 100 includes three electrodes. The three electrodes are two upper source electrodes 112 and one upper gate electrode 114. In FIG. 5A, part of each upper source electrode 112 and part of upper gate electrode 114 are exposed as source pad region 112P and gate pad region 114P, respectively.

Figure 6:
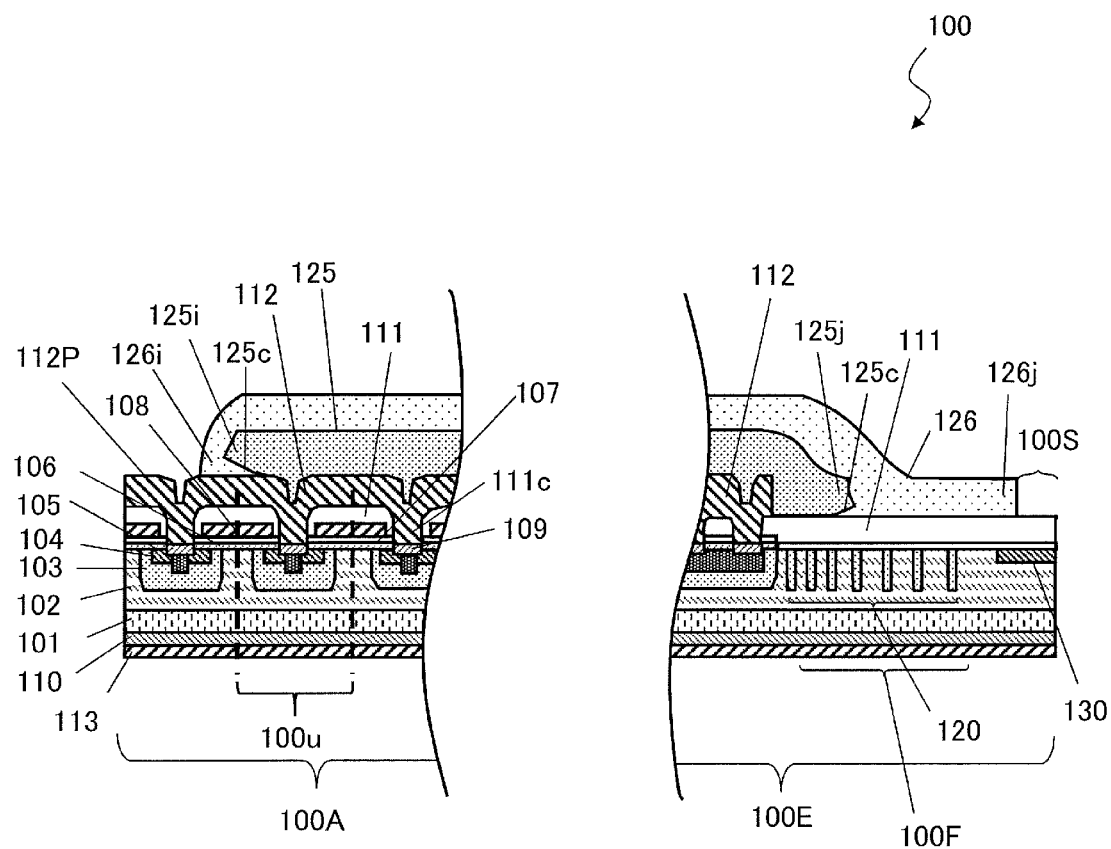
FIG. 6 is a schematic cross-sectional view, taken along line VI-VI of FIG. 5A, of the example configuration of semiconductor device 100.

FIG. 6 is a schematic cross-sectional view, taken along line VI-VI of FIG. 5A, of the example configuration of semiconductor device 100. An illustration of a configuration between two vertical wavy lines is omitted.

Inner edge portion 125i of inorganic protective layer 125 is formed on upper source electrode 112, and outer edge portion 125j of inorganic protective layer 125 is formed on interlayer insulating layer 111. Organic protective layer 126 covers inorganic protective layer 125.

The following describes a configuration other than inorganic protective layer 125 and organic protective layer 126.

Semiconductor device 100 includes semiconductor substrate 101 of a first conductivity type and first semiconductor layer 102 disposed on a principal surface of semiconductor substrate 101. On a back surface of semiconductor substrate 101, drain electrode 110 and wiring electrode 113 disposed on drain electrode 110 are positioned. In the present exemplary embodiment, the first conductivity type is an n-type, and a second conductivity type, which will be described later, is a p-type. However, the first conductivity type may be the p-type, and the second conductivity type may be the n-type.

Semiconductor device 100 is divided into active region 100A and end region 100E that surrounds active region 100A when viewed from a direction perpendicular to the principal surface of semiconductor substrate 101.

Semiconductor device 100 includes a plurality of unit cells 100u in active region 100A. Unit cells 100u each function as a MOSFET and are connected in parallel to each other. In other words, unit cells 100u configure transistors, and semiconductor device 100 includes the transistors. When viewed from the direction perpendicular to the principal surface of semiconductor substrate 101, unit cells 100u are arranged two-dimension ally.

Each unit cell 100u includes semiconductor substrate 101 of the first conductivity type, first semiconductor layer 102 of the first conductivity type positioned on semiconductor substrate 101, first body region 103 of the second conductivity type selectively formed at a surface of first semiconductor layer 102, source region 104 selectively formed at a surface of first body region 103, gate insulating film 107 positioned above first semiconductor layer 102, and gate electrode 108 positioned on gate insulating film 107. In the present exemplary embodiment, second semiconductor layer 106 is provided as a channel layer between first semiconductor layer 102 and gate insulating film 107. Gate electrode 108 is covered with interlayer insulating layer 111.

Opening 111c is formed in interlayer insulating layer 111. Source electrode 109 of each unit cell is connected in parallel to upper source electrode 112 through opening 111c. Gate electrode 108 is connected to upper gate electrode 114 through an opening other than opening 111c. Source electrode 109 and upper source electrode 112 may be collectively referred to as "source electrodes", and gate electrode 108 and upper gate electrode 114 may be collectively referred to as "gate electrodes".

In first semiconductor layer 102, source region 104 contains impurities of the first conductivity type (n⁺-type) at a high concentration. For electrical connection with first body region 103, first contact region 105 of the second conductivity type, which contains impurities of the second conductivity type at a higher concentration than first body region 103, is provided in source region 104 so as to be in contact with first body region 103 under source region 104. Also, source electrode 109 which is electrically connected to source region 101 and first contact region 105 through an ohmic contact is provided at the surface of first semiconductor layer 102. Thus, first body region 103 is electrically connected to source electrode 109 via first contact region 105.

In end region 100E, semiconductor device 100 includes at least one ring region 120 of the second conductivity type within first semiconductor layer 102 at the principal surface side. Ring region 120 allows semiconductor device 100 to have a high breakdown voltage. P-type ring region 120 has a ring shape surrounding active region 100A when viewed from the direction perpendicular to the principal surface of semiconductor substrate 101. A plurality of ring regions 120 form field limiting ring (FLR) region 110F. Each of the rings has a rectangular shape with four rounded corners when viewed from the direction perpendicular to the principal surface of semiconductor substrate 101. The shape of the four rounded corners of the ring prevents concentration of an electric field on the four corners. No inorganic protective layer 125 is formed between interlayer insulating layer 111 and organic protective layer 126 above most part of ring regions 120.

Semiconductor substrate 101 further includes scribe line region 100S located outside of end region 100E. The scribe line region is a margin used when a wafer is diced and cut into chips, and no metal is disposed in this region.

Semiconductor device 100 may further include, at the surface of first semiconductor layer 102, high concentration second contact region 130 of the first conductivity type selectively formed outside of FIJI region 100F to surround FLR region 100F. Second contact region 130 is provided not to form an ohmic contact with first semiconductor layer 102 but to function as a so-called channel stop region.

The disposition of inorganic protective layer 125 and organic protective layer 126 according to the present exemplary embodiment suppresses peeling of organic protective layer 126 even in a high-temperature environment. Also, inorganic protective layer 125 protected by organic protective layer 126 prevents moisture from entering semiconductor device 100 even in a high-humidity environment. As a result, semiconductor device 100 has high reliability even in a high temperature high humidity environment.

Third Exemplary Embodiment

The following describes an example in which the disposition of inorganic protective layer 125 and organic protective layer 12G according to the first exemplary embodiment is applied to a Sohottky barrier diode. The Schottky barrier diode wall hereinafter be referred to simply as the "semiconductor device".

Figure 7A:
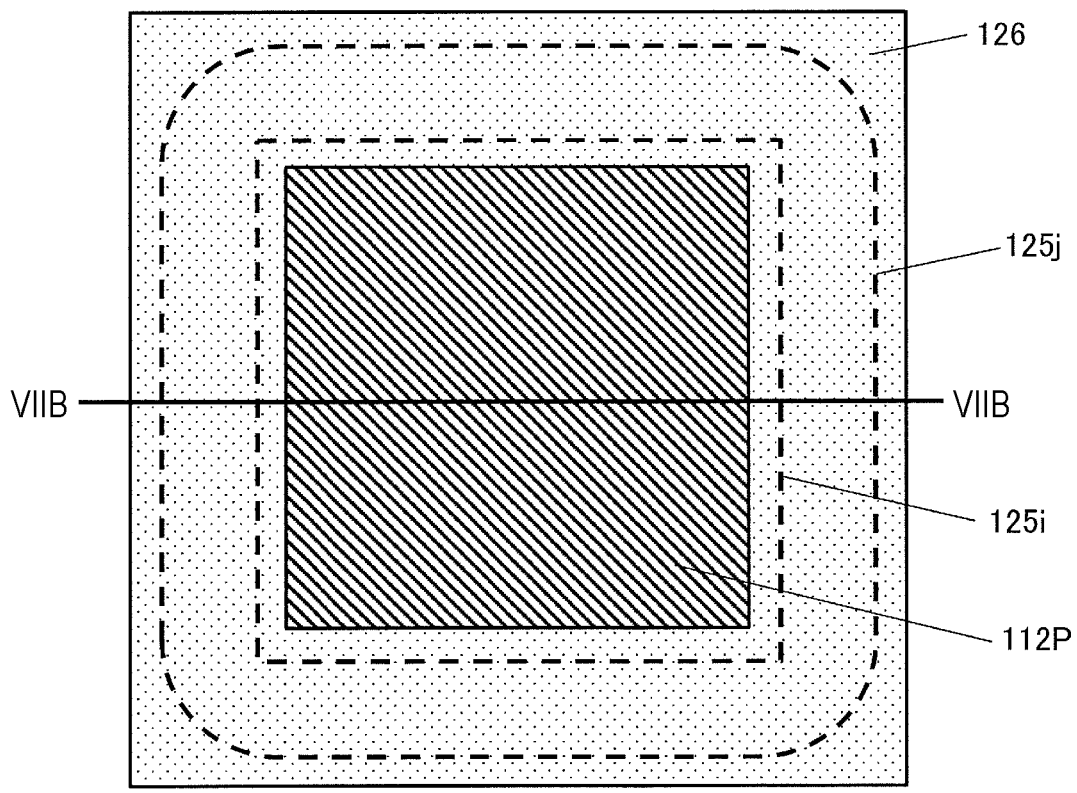
FIG. 7A is a schematic plan view of an example configuration of semiconductor device 100 according to the exemplary embodiment.

FIG. 7A is a schematic plan view of an example configuration of semiconductor device 100 according to the present exemplary embodiment. Pad region 112P is exposed at organic protective layer 126. Inorganic protective layer 125 is positioned under organic protective layer 126. Closed broken lines indicate an end face of inner edge portion 125i and an end face of outer edge portion 125j of inorganic protective layer 125. Inner edge portion 125i and outer edge portion 125j each have undercut 125c. This configuration suppresses peeling of organic protective layer 126 in any direction.

Figure 7B:
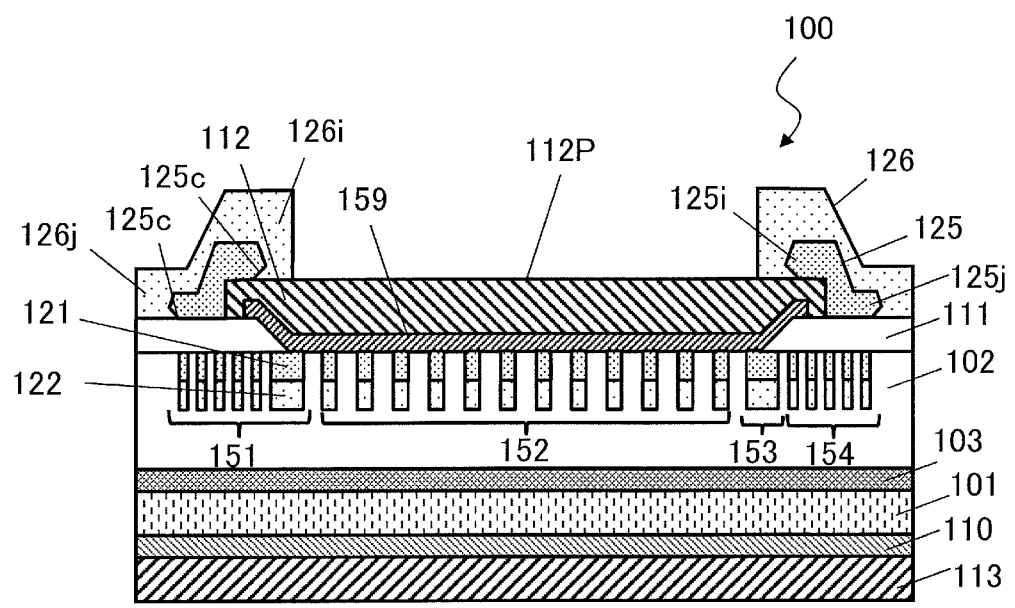
FIG. 7B is a schematic cross-sectional view, taken along line VIIB-VIIB of FIG. 7A of the example configuration of semiconductor device 100.

FIG. 7B is a schematic cross-sectional view, taken along line VIIB-VIIB of FIG. 7A, of the example configuration of semiconductor device 100. Semiconductor device 100 includes one electrode. The one electrode is upper electrode 112. In FIG. 7A, part of upper electrode 112 is exposed as pad region 112P.

In FIG. 7B, inner edge portion 125i of inorganic protective layer 125 is formed on upper electrode 112, and outer edge portion 125j of inorganic protective layer 125 is formed on interlayer insulating layer 111. Organic protective layer 126 covers inorganic protective layer 125.

The following describes a configuration other than inorganic protective layer 125 and organic protective layer 126.

Semiconductor device 100 includes semiconductor substrate 101 of a first conductivity type and drift layer 102, which is a semiconductor layer of the first conductivity type disposed on or over a principal surface of semiconductor substrate 101. In FIG. 7B, buffer layer 103 disposed between drift layer 102 and semiconductor substrate 101 may be omitted. In drift layer 102, end region 151 of a second conductivity type is disposed.

On drift layer 102, first electrode 159 is disposed. First electrode 159 forms a Schottky contact with drift layer 102. First electrode 159 is in contact, with end region 151 at an edge of the face in contact with drift layer 102 that is the semiconductor layer. First electrode 159 may be only metal material to be in contact with end region 151. End region 151 may have a non-ohmic contact with first electrode 159.

Second electrode 110 is disposed on a back surface of semiconductor substrate 101, the other side of semiconductor substrate 101 from the principal surface. Second electrode 110 forms an ohmic contact with semiconductor substrate 101. Back surface electrode 113 is disposed on a lower surface of second electrode 110, i.e., the other side of second electrode 110 from semiconductor substrate 101.

End region 151 may include guard ring region 153 of the second conductivity type and FLR region 154. Guard ring region 153 is in contact with part of first electrode 159, FIJI region 154 is a floating region of the second conductivity type disposed to surround guard ring region 153. FIJI region 154 is disposed to avoid contact with guard ring region 153. End region 151 is not hunted to the illustrated configuration, as long as end region 151 includes at least one region disposed to surround part of a surface of drift, layer 102.

A plurality of barrier regions 152 of the second conductivity type may be disposed in a region of drift layer 102 inside of end region 151 when viewed from a direction perpendicular to the principal surface of semiconductor substrate 101. The formation of barrier regions 152 reduces a Schottky leakage current when a reverse bias with respect to the Schottky contact formed between first electrode 150 and drift layer 102 is applied.

End region 151, that is guard ring region 153 and FLR region 154 in the present exemplary embodiment, includes high concentration region 121 of the second conductivity type and low-concentration region 122 of the second conductivity type. Like end region 151, barrier regions 152 may include high concentration region 121 of the second conductivity type and low concentration region 122 of the second conductivity type. High-concentration region 121 is disposed to come into contact with the surface of the semiconductor layer (i.e., the surface of drift layer 102 in the present exemplary embodiment). Low-concentration region 122 contains a lower concentration of impurities of the second conductivity type than high concentration region 121, and is positioned under high-concentration region 121. Also, high-concentration region 121 and low-concentration region 122 have an identical outline when viewed from the direction perpendicular to the principal surface of semiconductor substrate 101.

Interlayer insulating layer 111 is disposed on drift layer 102. Interlayer insulating layer 111 covers FLR region 154 and may cover part of guard ring region 153. Upper electrode 112 may be disposed on first electrode 159 to cover an upper surface and end faces of first electrode 159. End faces of upper electrode 112 may be located on interlayer insulating layer 111.

As in the second exemplary embodiment, the disposition of inorganic protective layer 125 and organic protective layer 126 according to the present exemplary embodiment enables semiconductor device 100 to have high reliability even in a high-temperature high-humidity environment.

A semiconductor device and a method for manufacturing the semiconductor device according to the exemplary embodiments of the present disclosure can be used for power devices and other applications.

What is claimed is:

1. A semiconductor device comprising:
   a semiconductor substrate;
   an interlayer insulating layer formed on a principal surface of the semiconductor substrate and having at least one opening;
   at least one electrode having part formed on an edge of the at least one opening, the at least one electrode having other part electrically connected, in the at least one opening, to the semiconductor substrate;
   an inorganic protective layer including an inner edge portion and an outer edge portion, the inner edge portion covering an edge of the at least one electrode, the outer edge portion being formed on the interlayer insulating layer; and
   an organic protective layer covering the inorganic protective layer, wherein:
   the inorganic protective layer has a first undercut formed between the inner edge and the at least one electrode and a second undercut formed between the outer edge and the interlayer insulating layer,
   a first space between the first undercut and the at least one electrode and a second space between the second undercut and the interlayer insulating layer are filled with the organic protective layer, and
   each of the first and second undercuts has a depth ranging from 0.45 μm to 1 μm inclusive in a direction parallel to the principal surface of the semiconductor substrate.

2. The semiconductor device according to claim 1, wherein the interlayer insulating layer is comprised of non-doped silica glass.

3. The semiconductor device according to claim 1, wherein the at least one electrode is comprised of aluminum.

4. The semiconductor device according to claim 1, wherein the inorganic protective layer is comprised of silicon nitride or silicon oxide.

5. The semiconductor device according to claim 1, wherein the organic protective layer is polyimide or polybenzoxazole.

6. The semiconductor device according to claim 1, wherein the first undercut of the inner edge portion of the inorganic protective layer is greater in depth than the second undercut of the outer edge portion of the inorganic protective layer in the direction parallel to the principal surface of the semiconductor substrate.

7. The semiconductor device according to claim 1, wherein the organic protective layer has a thickness ranging from 3 μm to 10 μm inclusive in a direction perpendicular to the principal surface of the semiconductor substrate.

8. The semiconductor device according to claim 1, wherein
   the semiconductor device is a metal oxide semiconductor field effect transistor,
   the at least one electrode includes three electrodes,
   the three electrodes are two source electrodes and one gate electrode, and
   the edge of each of the two source electrode and the one gate electrode is covered by the inorganic protective layer having the first undercut and the second undercut.

9. The semiconductor device according to claim 1, wherein the semiconductor device is a Schottky barrier diode, and
   includes one of the at least one electrode.

* * * * *